US012774523B2

United States Patent

(12) United States Patent
Lee et al.

(10) Patent No.: US 12,774,523 B2
(45) Date of Patent: Oct. 27, 2026

(54) FILM FORMING APPARATUS

(71) Applicant: SAMSUNG ELECTRONICS CO., LTD., Suwon-si (KR)

(72) Inventors: Jeonghyeon Lee, Suwon-si (KR); Sangyub Ie, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 440 days.

(21) Appl. No.: 18/465,130

(22) Filed: Sep. 11, 2023

(65) Prior Publication Data

US 2024/0084451 A1 Mar. 14, 2024

(30) Foreign Application Priority Data

Sep. 13, 2022 (KR) ........................ 10-2022-0115009

(51) Int. Cl.
*C23C 16/455* (2006.01)
*C23C 16/458* (2006.01)

(52) U.S. Cl.
CPC .... *C23C 16/45578* (2013.01); *C23C 16/4583* (2013.01)

(58) Field of Classification Search
CPC ........ C23C 16/45578; C23C 16/45561; C23C 16/45574
See application file for complete search history.

(56) References Cited

U.S. PATENT DOCUMENTS

| | | | | |
|---|---|---|---|---|
| 7,632,354 | B2 | 12/2009 | Dip et al. | |
| D771,543 | S | 11/2016 | Morita et al. | |
| D771,772 | S | 11/2016 | Morita et al. | |
| D773,609 | S | 12/2016 | Morita et al. | |
| D783,351 | S | 4/2017 | Fujino et al. | |
| D828,091 | S | 9/2018 | Fujino et al. | |
| D847,301 | S | 4/2019 | Yoshida et al. | |
| D888,196 | S | 6/2020 | Okajima et al. | |
| D889,596 | S | 7/2020 | Okajima et al. | |
| D890,572 | S | 7/2020 | Saiki et al. | |
| D937,385 | S | 11/2021 | Takeshita et al. | |
| 2008/0145533 | A1 | 6/2008 | Honda et al. | |
| 2008/0317976 | A1* | 12/2008 | Ando | C23C 16/4583 118/723 R |
| 2009/0291566 | A1 | 11/2009 | Ueno et al. | |
| 2010/0151682 | A1 | 6/2010 | Moriya et al. | |
| 2012/0076936 | A1 | 3/2012 | Hirano | |
| 2012/0192792 | A1 | 8/2012 | Mahajani et al. | |

(Continued)

FOREIGN PATENT DOCUMENTS

| | | |
|---|---|---|
| CN | 109943827 | 6/2019 |
| CN | 111868897 | 10/2020 |

(Continued)

*Primary Examiner* — Joseph A Miller, Jr.
(74) *Attorney, Agent, or Firm* — Morgan, Lewis & Bockius LLP

(57) ABSTRACT

A film forming apparatus, may include: a chamber having an internal space and an exhaust port; a wafer carrier disposed in the internal space of the chamber; a gas supply pipe disposed through the chamber; and an injector disposed in the internal space of the chamber and connected to the gas supply pipe, wherein the gas supply pipe may be connected to a central portion of the injector in a longitudinal direction.

20 Claims, 7 Drawing Sheets

(56) References Cited

U.S. PATENT DOCUMENTS

| | | | | |
|---|---|---|---|---|
| 2014/0038394 | A1* | 2/2014 | Watanabe | H10P 14/3416 118/725 |
| 2017/0051408 | A1 | 2/2017 | Takagi et al. | |
| 2017/0051409 | A1* | 2/2017 | Noh | C23C 16/45574 |
| 2017/0232457 | A1 | 8/2017 | Fujino et al. | |
| 2017/0253971 | A1* | 9/2017 | Kawamorita | C23C 16/45561 |
| 2018/0076017 | A1 | 3/2018 | Hasimoto et al. | |
| 2018/0087152 | A1 | 3/2018 | Yoshida | |
| 2018/0363137 | A1 | 12/2018 | Takagi et al. | |
| 2019/0330740 | A1* | 10/2019 | Klaver | C23C 16/4401 |
| 2020/0392625 | A1 | 12/2020 | Takebayashi et al. | |
| 2021/0252544 | A1 | 8/2021 | Abe et al. | |
| 2022/0081775 | A1* | 3/2022 | Iriuda | C23C 16/52 |

FOREIGN PATENT DOCUMENTS

| | | |
|---|---|---|
| CN | 113265645 | 8/2021 |
| CN | 215925068 | 3/2022 |
| JP | S55162365 | 12/1980 |
| JP | H06349761 | 12/1994 |
| JP | H08195349 | 7/1996 |
| JP | H09260298 | 10/1997 |
| JP | H10284426 | 10/1998 |
| JP | 2002290072 | 10/2002 |
| JP | 2012069723 | 4/2012 |
| JP | 2012114200 | 6/2012 |
| JP | 2012161386 | 8/2012 |
| JP | 2012178490 | 9/2012 |
| JP | 2012178492 | 9/2012 |
| JP | 2016122691 | 7/2016 |
| JP | 201728256 | 2/2017 |
| JP | 2018056280 | 4/2018 |
| JP | 2019204962 | 11/2019 |
| JP | 2021097245 | 6/2021 |
| JP | 2021129060 | 9/2021 |
| KR | 10-2006-0082142 | 7/2006 |
| KR | 10-0720995 | 5/2007 |
| KR | 10-2008-0048974 | 6/2008 |
| KR | 10-2009-0016924 | 2/2009 |
| KR | 10-2009-0055346 | 6/2009 |
| KR | 10-2009-0055347 | 6/2009 |
| KR | 10-2009-0061305 | 6/2009 |
| KR | 10-2010-0039084 | 4/2010 |
| KR | 10-1044913 | 6/2011 |
| KR | 10-2012-0135181 | 12/2012 |
| KR | 10-1464644 | 11/2014 |
| KR | 10-1502816 | 3/2015 |
| KR | 10-2017-0009725 | 1/2017 |
| KR | 10-2017-0095749 | 8/2017 |
| KR | 10-2018-0090767 | 8/2018 |
| KR | 10-2019-0022590 | 3/2019 |
| KR | 10-2021-0035795 | 4/2021 |
| TW | 202131430 | 8/2021 |
| WO | 2007018016 | 2/2007 |
| WO | 2018008088 | 1/2018 |
| WO | 2019188017 | 10/2019 |
| WO | 2020189205 | 9/2020 |
| WO | 2022059628 | 3/2022 |

* cited by examiner

FILM FORMING APPARATUS

CROSS-REFERENCE TO RELATED APPLICATION

This application claims priority under 35 U.S.C. § 119 to Korean Patent Application No. 10-2022-0115009, filed on Sep. 13, 2022, with the Korean Intellectual Property Office, the disclosure of which is incorporated by reference herein in its entirety.

TECHNICAL FIELD

The present disclosure relates to a film forming apparatus, and more particularly to a film forming apparatus including an injector providing an even gas supply.

DISCUSSION OF RELATED ART

The manufacturing of semiconductor devices may utilize various processes such as film formation, etching, oxidation, diffusion, and reformation. These processes may be performed on an object to be processed, for example, a semiconductor wafer.

The film formation process may be performed, for example, in a batch-type film forming apparatus having a bell-shaped chamber. To this end, an injector for injecting gas for film formation is provided in the bell-shaped chamber. The injector includes a tube with nozzles disposed along its length. A gas supply pipe supplying gas to the injector is connected to a lower end portion of the injector to supply gas to the injector.

The gas may be, for example, a silicon source gas or a reactive gas. When the gas is injected into the chamber using the injector, a dispersion pattern of the gas is uneven. With the uneven dispersion pattern, a concentration of the gas becomes insufficient away from the injector, along a path of the gas, so that a gradient occurs in a thickness of the film formed on the semiconductor wafer.

SUMMARY

According to an aspect of the present inventive concept, a film forming apparatus is provided capable of forming a uniform film on a wafer by making a dispersion of gas supplied to a wafer of a chamber more uniform.

According to an aspect of the present inventive concept, a film forming apparatus, may include: a chamber having an internal space and an exhaust port; a wafer carrier disposed in the internal space of the chamber; a gas supply pipe disposed through the chamber; and an injector disposed in the internal space of the chamber and connected to the gas supply pipe, wherein the gas supply pipe may be connected to a central portion of the injector in a longitudinal direction.

According to an aspect of the present inventive concept, a film forming apparatus may include: a chamber comprising a lower end portion and an upper end portion; a wafer carrier inside the chamber, wherein the wafer carrier extends in a longitudinal direction between the lower end portion and the upper end portion of the chamber; a gas supply pipe disposed through the chamber; and an injector disposed in the chamber and connected to the gas supply pipe, wherein the injector extends in a longitudinal direction and comprises a plurality of nozzles, wherein the gas supply pipe is connected a central portion of the injector in the longitudinal direction.

According to an aspect of the present inventive concept, a film forming apparatus may include: a wafer carrier; a plurality of first injectors, each of the first injectors comprising a pipe disposed in a first direction; and a plurality of second injectors, each of the second injectors comprising a plurality of pipes disposed in the first direction, wherein the first injectors and the second injectors are disposed around the wafer carrier.

BRIEF DESCRIPTION OF THE DRAWINGS

The above and other aspects, features, and advantages of the present inventive concept will be more clearly understood from the following detailed description taken in conjunction with the accompanying drawings, in which.

DETAILED DESCRIPTION

Hereinafter, example embodiments of the present inventive concept will be described with reference to the accompanying drawings as follows.

Figure 1:
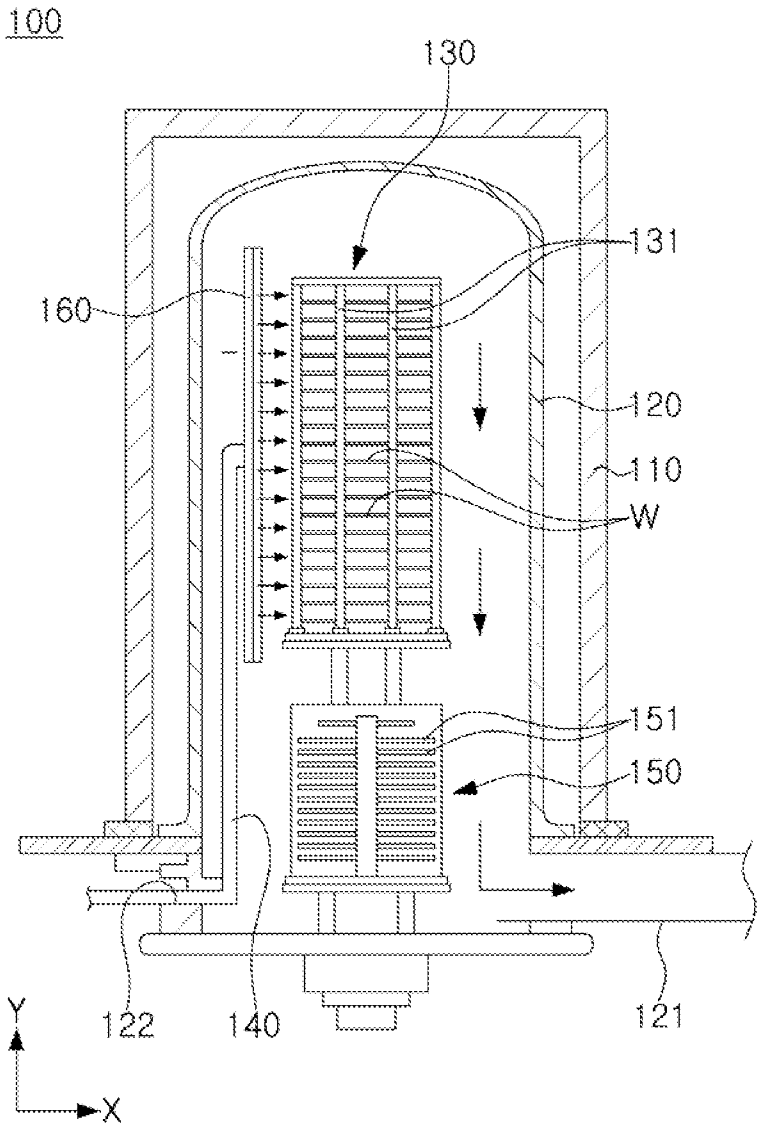
FIG. 1 is a schematic configuration diagram illustrating a film forming apparatus according to an exemplary embodiment.
Figure 2:
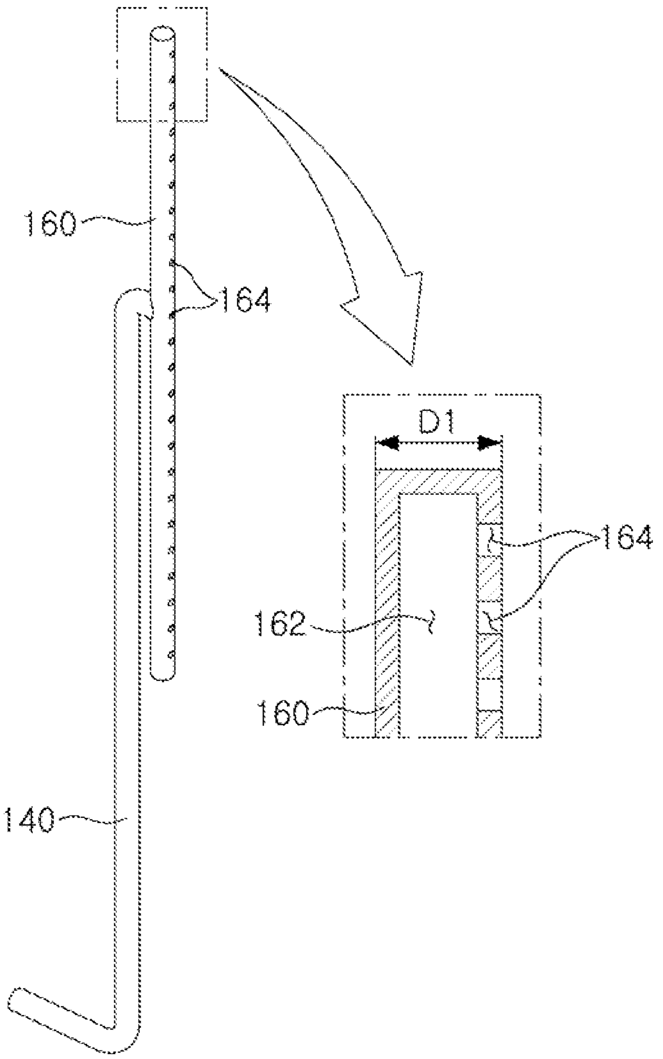
FIG. 2 is a cross-sectional view illustrating an injector included in a film forming apparatus according to an exemplary embodiment.

FIG. 1 is a schematic configuration diagram illustrating a film forming apparatus 100 according to an exemplary embodiment. FIG. 2 is a cross-sectional view illustrating an injector included in a film forming apparatus according to an exemplary embodiment.

Referring to FIGS. 1 and 2, the film forming apparatus 100 includes, as an example, a chamber 120, a wafer carrier 130, a gas supply pipe 140, a heat dissipation unit 150, and an injector 160.

The chamber 120 has an internal space and may have an exhaust port 121 through which gas may be exhausted. As an example, the chamber 120 may be disposed inside a heater 110 as a heating device. The heater 110 may provide heat energy to the chamber 120, and heat an inside of the chamber 120. For example, the heater 110 may be comprised of a tubular (for example, cylindrical) heat insulating member and a heating element provided on an inner surface of the heat insulating member. The heater 110 may be divided into a plurality of regions in a height direction so that temperature control may be performed. In addition, the chamber 120 may have a through-hole 122, through which a gas supply pipe 140 for supplying gas to the chamber 120 may be installed. The through-hole 122 may be provided in a lower end portion of the chamber 120.

As an example, the chamber 120 may be made of a heat-resistant glass material such as quartz ($SiO_2$), silicon carbide (SiC), or the like, and may have a cylindrical shape with an upper end closed and a lower end open. The chamber 120 provides a space for film formation on the wafer (W). The chamber 120 illustrated in FIG. 1 is exemplary and embodiments are not limited to the form illustrated. For example, the chamber 120 may have a variety of shapes, such as a bell-shaped chamber as illustrated.

The wafer carrier 130 may be installed inside the chamber 120, and a plurality of wafers W may be sequentially stacked on the wafer carrier 130 from a lower end portion to an upper end portion of the chamber 120. To this end, the wafer carrier 130 may have a plurality of supports 131 for accommodating a plurality of wafers W in multiple stages. As an example, like the chamber 120, the wafer carrier 130 may be formed of a heat-resistant glass material such as quartz ($SiO_2$), silicon carbide (SiC), or the like.

The gas supply pipe 140 may be installed in the chamber 120, and one end portion thereof may be disposed inside the chamber 120 through the through-hole 122 of the chamber 120. As an example, the gas supply pipe 140 may be connected to the injector 160. The injector 160 may have a straight tube shape. The injector 160 may supply gas into the chamber 120 accommodating the wafers W. Although one gas supply pipe 140 is illustrated in FIG. 1, a plurality of gas supply pipes 140 may be used. For example, the plurality of gas supply pipes 140 may be spaced apart from each other in a circumferential direction of the chamber 120. As an example, three gas supply pipes 140 may be spaced apart from each other in the circumferential direction of the chamber 120. The gas supply pipe 140 may be connected to a central portion of the injector 160 in a longitudinal direction. Accordingly, the gas supplied through the gas supply pipe 140 may flow from the central portion of the injector 160 to upper end and lower end portions thereof. A more detailed description of this will be described later.

The injector 160 may be connected to the gas supply pipe 140 to inject gas into the chamber 120 accommodating the wafer W. As an example, the gas supply pipe 140 may be connected to the central portion of the injector 160 in the longitudinal direction and flow from the central portion of the injector 160 to upper and lower end portions thereof. The injector 160 may be comprised of one pipe connected to the gas supply pipe 140.

Referring to FIG. 2, a gas flow passage 162 and a plurality of nozzles 164 connected to the gas flow passage 162 may be formed in the injector 160. In addition, the injector 160 may have, for example, a circular tube shape having an outer diameter D1, and may be disposed in the longitudinal direction of the chamber 120. The outer diameter D1 may be uniform along a length of the injector 160. In addition, the injector 160 may have, for example, a shape in which an upper end portion and a lower end portion are closed. In other words, the gas supplied to the central portion of the injector 160 may be injected through the nozzles 164 and may not be discharged through the upper and lower portions of the injector 160. Here, the longitudinal direction refers to a Y-axis direction of FIG. 1, and a width direction refers to an X-axis direction of FIG. 1.

The gas flow passage 162 may have a uniform diameter along a length of the injector 160. The gas flow passage 162 may extend through the gas supply pipe 140, and a gas may be supplied by the gas supply pipe 140 into the injector 160 through the gas flow passage 162. As an example, a cross-sectional area of the gas flow passage of the gas supply pipe 140 may be greater than or equal to a cross-sectional area of the gas flow passage 162. Accordingly, a velocity of gas may be increased in the gas flow passage 162. Similarly, a velocity of gas injected into the chamber 120 from the nozzles 164 may depend, in part, on a cross-sectional area of the nozzles 164.

As described above, the gas supply pipe 140 may be connected to the injector 160 at the central portion of the injector 160 in the longitudinal direction, and a difference between the amount of gas injected from the nozzles 164 disposed in the central portion of the injector 160 and the amount of gas injected from the nozzles 164 disposed in the upper end and the lower end portions of the injector 160 may be reduced. That is, a dispersion of gas in the chamber 120 may be improved. Accordingly, a uniform film may be formed on the wafers W in the chamber 120. A more detailed description thereof will be described later.

According to an example embodiment of the present inventive concept, a film forming apparatus may form a uniform film on a wafer by making a dispersion of gas supplied to the wafer in the chamber uniform. For example, referring to FIGS. 1 and 2, the gas supply pipe 140 may be connected to the injector 160 at the central portion of the injector 160 in the longitudinal direction, and the nozzles 164 of the injector 160 may face the wafer carrier 130. That is, the nozzles 164 may direct gas having a uniform dispersion across the wafers W supported by the wafer carrier 130.

Figure 3:
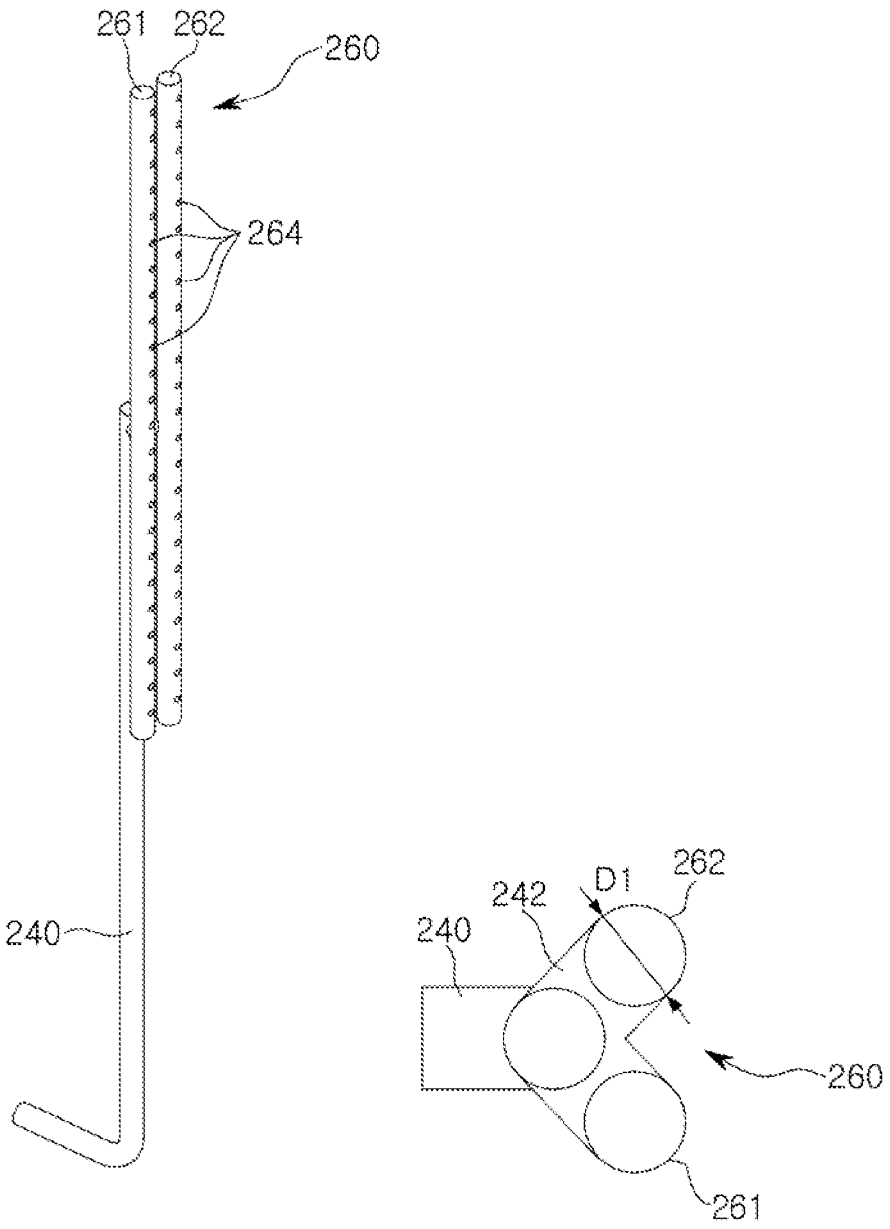
FIG. 3 is a schematic configuration diagram illustrating a gas supply pipe and an injector provided in a film forming apparatus according to an exemplary embodiment.

FIG. 3 is a schematic configuration diagram illustrating a gas supply pipe and an injector provided in a film forming apparatus according to an exemplary embodiment.

Referring to FIG. 3, a gas supply pipe 240 may be connected to an injector 260. The gas supply pipe 240 may supply gas to the injector 260, which injects the gas into the chamber 120 accommodating the wafers W (see FIG. 1). As an example, the gas supply pipe 240 may be connected to the injector 260 at a central portion of the injector 260 in a longitudinal direction thereof. The gas supply pipe 240 may include a plurality of branch pipe portions 242. The branch pipe portions 242 may connect the gas supply pipe 230 with the injector 260. The injector 260 may include a plurality of pipes. For example, the injector 260 may include a first pipe 261 and a second pipe 262. Accordingly, the gas supplied through the gas supply pipe 240 may be branched through the branch pipe portion 242 and supplied to the first pipe 261 and the second pipe 262 of the injector 260.

The injector 260 is connected to the gas supply pipe 240 to inject gas into the chamber 120 accommodating the wafers W. As described above, the gas supply pipe 240 may be connected to the injector 260 at the central portion of the injector 260 in the longitudinal direction. The injector 260 may be comprised of a plurality of pipes. A gas flow passage (not shown) through which gas may be supplied from the gas supply pipe 240 and a plurality of nozzles 264 connected to the gas flow passage may be formed in the injector 260. The pipes of the injector 260 may have, for example, a circular tube shape having an outer diameter D1. The outer diameter D1 may be uniform along a length of the pipes. In addition, the injector 260 may have, for example, a shape in which an upper end portion and a lower end portion are closed. In other words, the gas supplied to the central portion of the injector 260 is injected into the chamber 120 through the nozzles 264, and may not be discharged through the upper and lower portions of the injector 260.

A cross-sectional area of the gas flow passage of the gas supply pipe 240 may be greater than or equal to a cross-sectional area of the gas flow passages of the pipes of the injector 260. Accordingly, a velocity of gas may be increased in the pipes of the injector 260. Similarly, a velocity of gas injected into the chamber 120 from the nozzles 264 may depend, in part, on a cross-sectional area of the nozzles 264.

As described above, since the gas supply pipe 240 may be connected to the injector 260 at the central portion of the injector 260 in the longitudinal direction, and a difference between the amount of gas injected into the chamber 120 from the nozzles 264 disposed in the central portion of the injector 260 and the amount of gas injected into the chamber 120 from the nozzles 264 in the upper and lower end portions may be reduced. Accordingly, a uniform film may be formed on the wafers W accommodated by the chamber 120.

Figure 4:
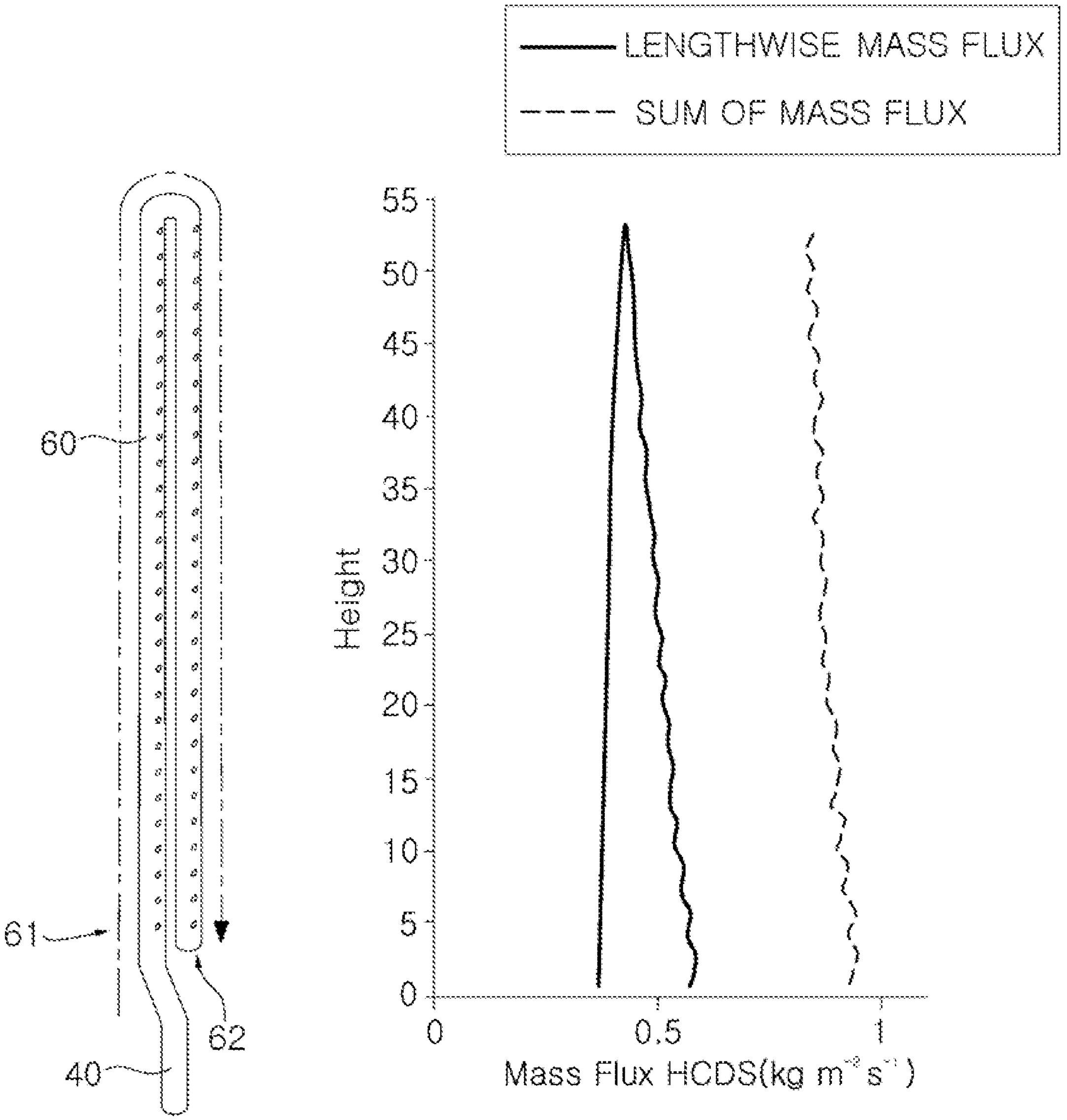
FIG. 4 is a graph illustrating an injector and a mass flux injected through the injector.

FIG. 4 is a graph illustrating an amount of gas that may be expelled by an injector when a gas supply pipe 40 is connected to the injector 60 at a proximal portion 61 of the injector 60. The amount of gas expelled through the nozzles may be large at the proximal portion thereof and may decrease toward a distal end portion 62, lengthwise along the injector 60. A difference between the amount of gas expelled from the proximal portion 61 and the amount of gas expelled from the distal end portion 62 thereof is large as illustrated by the sum of mass flux along a height of the injector 60.

Figure 5:
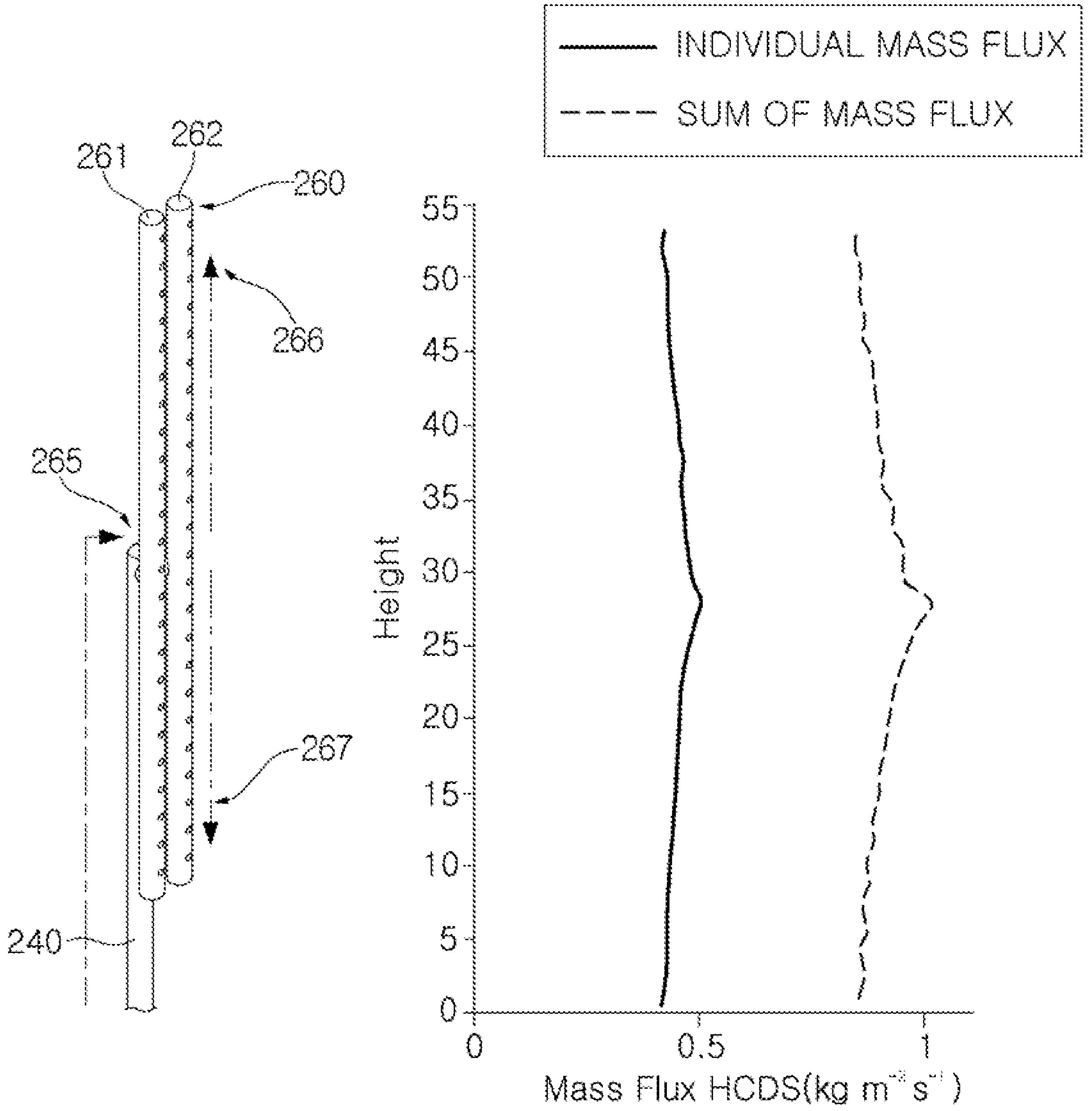
FIG. 5 is a graph illustrating an injector provided in a film forming apparatus and a mass flux injected through the injector according to an exemplary embodiment.

FIG. 5 is a graph illustrating an amount of gas that may be injected into the chamber 120 when the gas supply pipe 240 is connected to the injector 260 at the central portion 265 of the injector 260. The individual mass flux refers to a partial mass flux provided by each of the pipes of the injector 260. The sum of mass flux refers to the combined mass flux of the first pipe 261 and the second pipe 262. The amount of gas injected into the chamber 120 through the nozzles is uniform, with little difference from the central portion 265 toward the upper end portion 266 and the lower end portion 267. In other words, since the difference between the amount of gas injected into the chamber 120 from the injector 260 along a length of the injector 260 is not large, and the largest amount of gas may be supplied to a central portion of the chamber where a reaction region per unit volume is expected to be large, gas dispersion during the process may be improved.

Figure 6:
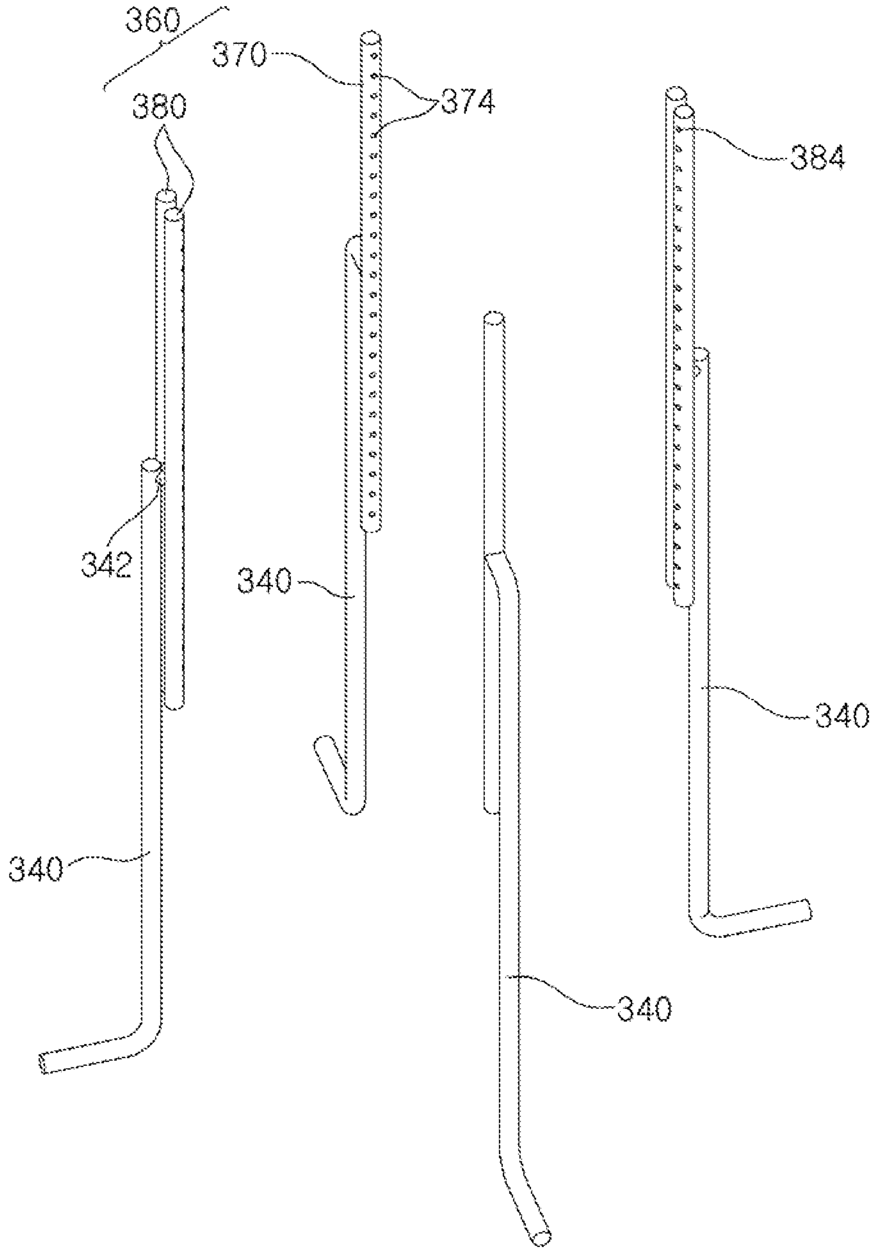
FIG. 6 is a schematic configuration diagram illustrating a gas supply pipe and an injector provided in a film forming apparatus according to an exemplary embodiment.

FIG. 6 is a schematic configuration diagram illustrating a gas supply pipe and an injector provided in a film forming apparatus according to an embodiment.

Referring to FIG. 6, a gas supply pipe 340 is connected to a plurality of injectors 360. The gas supply pipe 340 and injectors 360 may supply gas injected into the chamber 120 accommodating the wafers W (see FIG. 1). As an example, the gas supply pipe 340 may be a plurality of gas supply pipes, and the plurality of gas supply pipes may be respectively connected to the plurality of injectors 360. The gas supply pipe 340 may be connected to the injector 360 at a central portion of the injector 360 in a longitudinal direction.

The injector 360 is connected to the gas supply pipe 340 to inject gas into the chamber 120 accommodating the wafers W. One or more of the injectors 360 may include a first injector 370 comprised of one pipe. One or more of the injectors 360 may include a second injector 380 comprised of a plurality of pipes. For example, the second injector 380 may include a branch pipe portion 342, branched into a plurality of branches.

The gas supply pipe 340 may be connected to the first injector 370 at a central portion of the first injector 370 in a longitudinal direction thereof. The gas supply pipe 340 may be connected to the second injector 380 at a central portion of the second injector 380 in a longitudinal direction thereof. A gas flow passage (not shown) through which gas may be supplied from the gas supply pipe 340 and a plurality of nozzles 374 and 384 connected to the gas flow passage may be formed in the first injector 370 and the second injector 380. In addition, the first injector 370 and the second injector 380 may have, for example, a shape in which upper and lower end portions thereof are closed. In other words, the gas supplied to the central portion of the first injector 370 and the second injector 380 may be injected into the chamber 120 through the nozzles 374 and 384 and is not discharged through upper and lower portions of the first injector 370 and the second injector 380.

A gas flow passage may have a uniform diameter. The diameter of the gas flow passage may be uniform along its length. As an example, a cross-sectional area of the gas flow passage of the gas supply pipe 340 may be greater than or equal to a cross-sectional area of the gas flow passage of the injector 360. Accordingly, a velocity of gas may be increased in the injector 360. Similarly, a velocity of gas injected into the chamber 120 from the nozzles 374 and 384 may depend, in part, on a cross-sectional area of the nozzles 373 and 384.

Figure 7:
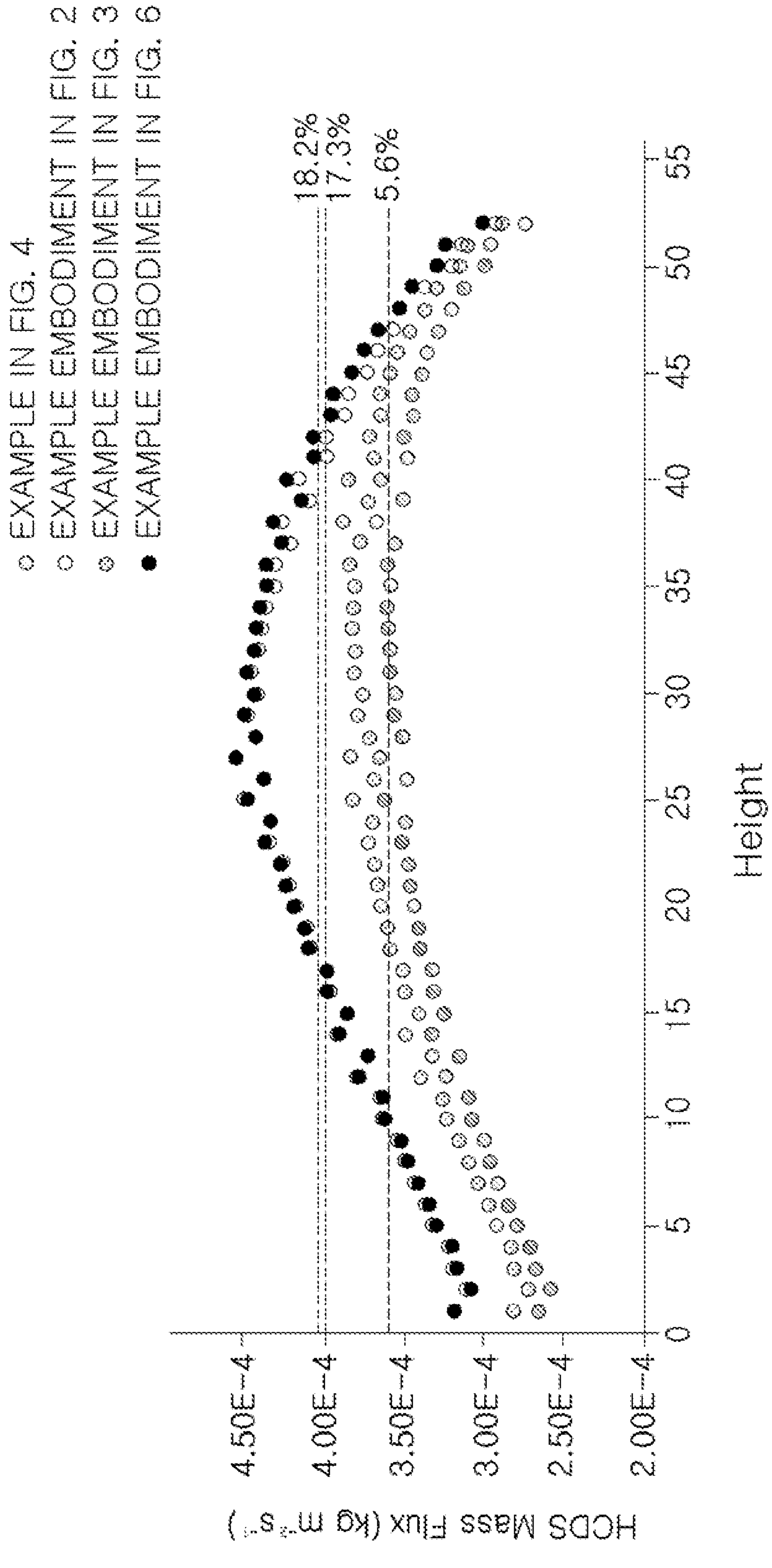
FIG. 7 is a graph illustrating a mass flux by the injectors illustrated in FIGS. 2, 3, 4, and 6.

As shown in FIG. 7, when the injector 360 includes the first injector 370 and the second injector 380 (see example embodiment in FIG. 6), a mass flux of gas is improved. The example of FIG. 4 has a low mass flux of gas. In an example embodiment illustrated in FIG. 2 having the injector 160 and in an example embodiment illustrated in FIG. 3 having the injector 260, it can be seen that a mass flux of gas is improved in both cases. Compared to an example of FIG. 4, an average mass flux is improved by about 5.6% in the case of an example embodiment illustrated in FIG. 2, an average mass flux is improved by about 17.3% in the case of an example embodiment illustrated in FIG. 3, and an average mass flux is improved by about 18.2% in the case of an example embodiment illustrated in FIG. 6 having both the first injector 370 and the second injector 380.

As set forth above, according to an example embodiment of the present inventive concept, it is possible to provide a film forming apparatus capable of forming a uniform film on a wafer by making a dispersion of gas supplied to the wafer in the chamber more uniform.

While example embodiments have been shown and described above, it will be apparent to those skilled in the art that modifications and variations could be made without departing from the scope of the present inventive concept as defined by the appended claims.

What is claimed is:

1. A film forming apparatus, comprising:
a chamber having an internal space and an exhaust port;
a wafer carrier disposed in the internal space of the chamber;
a gas supply pipe disposed through the chamber; and
an injector disposed in the internal space of the chamber and connected to the gas supply pipe,
wherein the injector comprises a plurality of pipes, and
wherein each pipe of the plurality of pipes is connected to the gas supply pipe via a branch pipe portion located at a central portion of each pipe of the plurality of pipes.

2. The film forming apparatus of claim 1, wherein the injector is disposed in a longitudinal direction of the chamber,
wherein the injector comprises a gas flow passage and a plurality of nozzles connected to the gas flow passage.

3. The film forming apparatus of claim 1, wherein the injector is comprised of a pipe connected to the gas supply pipe.

4. The film forming apparatus of claim 1, wherein the injector has a straight tube shape.

5. The film forming apparatus of claim 1, wherein the injector comprises a gas flow passage and the gas flow passage has a uniform diameter.

6. The film forming apparatus of claim 2, wherein the injector comprises a plurality of pipes connected to the gas supply pipe.

7. The film forming apparatus of claim 6, wherein the plurality of pipes of the injector have a straight tube shape having a circular cross-section.

8. The film forming apparatus of claim 6, wherein the gas flow passage extends into the pipes and the gas flow passage of the pipes has a uniform diameter.

9. The film forming apparatus of claim 6, further comprising a branch pipe portion connecting the gas supply pipe to the pipes of the injector.

10. The film forming apparatus of claim 2, wherein the gas flow passage extends into the gas supply pipe, wherein a cross-sectional area of the gas flow passage of the gas supply pipe is greater than or equal to a cross-sectional area of the gas flow passage of the injector.

11. The film forming apparatus of claim 1, wherein the injector is a first injector comprising one pipe connected to the gas supply pipe and the film forming apparatus further comprises a second injector disposed in the chamber and connected to the gas supply pipe, wherein the second injector comprises a plurality of pipes connected to the gas supply pipe.

12. A film forming apparatus, comprising:

a chamber comprising a lower end portion and an upper end portion;

a wafer carrier inside the chamber, wherein the wafer carrier extends in a longitudinal direction between the lower end portion and the upper end portion of the chamber;

a gas supply pipe disposed through the chamber; and an injector disposed in the chamber and connected to the gas supply pipe, wherein the injector extends in a longitudinal direction and comprises a plurality of nozzles, wherein the injector comprises a plurality of pipes, and wherein each pipe of the plurality of pipes is connected to the gas supply pipe via a branch pipe portion located at a central portion of each pipe of the plurality of pipes.

13. The film forming apparatus of claim 12, wherein the nozzles face the wafer carrier.

14. The film forming apparatus of claim 12, wherein the injector has a straight tube shape.

15. The film forming apparatus of claim 12, wherein the injector comprises a plurality of pipes connected to the gas supply pipe.

16. The film forming apparatus of claim 15, further comprising a branch pipe portion connecting the gas supply pipe to the pipes of the injector.

17. The film forming apparatus of claim 12, wherein the injector is a first injector comprising one pipe connected to the gas supply pipe and the film forming apparatus further comprises a second injector disposed in the chamber and connected to the gas supply pipe, wherein the second injector comprises a plurality of pipes connected to the gas supply pipe.

18. A film forming apparatus, comprising:

a wafer carrier;

a plurality of first injectors, each of the first injectors comprising a pipe disposed in a first direction; and a plurality of second injectors, each of the second injectors comprising a plurality of pipes disposed in the first direction, wherein the first injectors and the second injectors are disposed around the wafer carrier, wherein a first gas supply pipe is connected to each of the first injectors, and wherein a second gas supply pipe comprises a branch pipe portion located at a central portion of each of the second injectors in the first direction connecting the second gas supply pipe to the plurality of pipes of each of the second injectors.

19. The film forming apparatus of claim 18, wherein the first injectors and the second injectors comprise a plurality of nozzles facing the wafer carrier.

20. The film forming apparatus of claim 18, further comprising a chamber having an internal space, wherein the chamber comprises a lower end portion and an upper end portion, wherein the first injectors and the second injectors are disposed in the internal space, and wherein the wafer carrier extends in the first direction between the lower end portion and the upper end portion of the chamber.

* * * * *